(12) United States Patent
Ren et al.

(10) Patent No.: US 11,282,974 B2
(45) Date of Patent: Mar. 22, 2022

(54) PHOTOSENSITIVE ELEMENT AND MANUFACTURING METHOD THEREOF, DISPLAY PANEL AND MANUFACTURING METHOD THEREOF

(71) Applicant: BOE Technology Group Co., Ltd., Beijing (CN)

(72) Inventors: Qingrong Ren, Beijing (CN); Jianming Sun, Beijing (CN); Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 102 days.

(21) Appl. No.: 16/169,365

(22) Filed: Oct. 24, 2018

(65) Prior Publication Data

US 2019/0305156 A1    Oct. 3, 2019

(30) Foreign Application Priority Data

Mar. 28, 2018 (CN) .......................... 201810266890.9

(51) Int. Cl.
*H01L 31/032* (2006.01)
*H01L 27/32* (2006.01)
(Continued)

(52) U.S. Cl.
CPC ...... *H01L 31/0322* (2013.01); *H01L 27/3227* (2013.01); *H01L 31/0336* (2013.01);
(Continued)

(58) Field of Classification Search
CPC ... H01L 27/3227; H01L 31/0322–0323; H01L 31/03923; H01L 31/03928;
(Continued)

(56) References Cited

U.S. PATENT DOCUMENTS

2002/0079512 A1 * 6/2002 Yamazaki .............. H04N 1/024
257/200
2010/0295145 A1 * 11/2010 Miyazaki .............. H01L 31/109
257/458
(Continued)

FOREIGN PATENT DOCUMENTS

| CN | 1585140 A | 2/2005 |
| CN | 103117323 A | 5/2013 |

(Continued)

OTHER PUBLICATIONS

Siebentritt, et al. "Why do we make Cu(In,Ga)Se2 solar cells non-stoichiometric?" Solar Energy Materials and Solar Cells 119 (2013): 18-25.*
(Continued)

*Primary Examiner* — William E McClain
(74) *Attorney, Agent, or Firm* — Dilworth & Barrese, LLP.; Michael J. Musella, Esq.

(57) ABSTRACT

A photosensitive element includes a first film layer, a second film layer and a third film layer. The first film layer, the second film layer and the third film layer are in a sequentially stacked structure, the first film layer is a p-type copper indium gallium selenide (CIGS) layer, the second film layer is an i-type CIGS layer, and the third film layer is an n-type film layer, and the first film layer, the second film layer and the third film layer form a PIN junction structure.

19 Claims, 4 Drawing Sheets

(51) Int. Cl.
  *H01L 31/0336* (2006.01)
  *H01L 31/0392* (2006.01)
  *H01L 31/105* (2006.01)
  *H01L 31/0296* (2006.01)

(52) U.S. Cl.
  CPC .. *H01L 31/03923* (2013.01); *H01L 31/03925* (2013.01); *H01L 31/105* (2013.01); *H01L 27/3244* (2013.01); *H01L 31/0296* (2013.01); *H01L 2227/323* (2013.01); *Y02P 70/50* (2015.11)

(58) Field of Classification Search
  CPC ..... H01L 31/0326–0327; H01L 31/186–1872; H01L 2924/10821–10823; Y02E 10/541
  See application file for complete search history.

(56) References Cited

U.S. PATENT DOCUMENTS

| | | | | |
|---|---|---|---|---|
| 2011/0024859 | A1* | 2/2011 | Miyazaki | H01L 27/14645 257/432 |
| 2012/0260966 | A1* | 10/2012 | Lee | H01L 31/03926 136/244 |
| 2013/0146142 | A1 | 6/2013 | Shibasaki et al. | |
| 2013/0284253 | A1* | 10/2013 | Krasnov | H01L 31/022425 136/256 |
| 2014/0131728 | A1* | 5/2014 | Park | H01L 31/0326 257/76 |
| 2014/0144502 | A1* | 5/2014 | Nakagawa | H01L 31/0323 136/256 |
| 2014/0246087 | A1 | 9/2014 | Hiraga et al. | |
| 2018/0053032 | A1* | 2/2018 | Ding | G06K 9/0004 |

FOREIGN PATENT DOCUMENTS

| | | | | |
|---|---|---|---|---|
| CN | 103887316 | A | 6/2014 | |
| CN | 103946992 | A | 7/2014 | |
| CN | 105355716 | A | 2/2016 | |
| CN | 205595351 | U | 9/2016 | |
| GB | 2400725 | A * | 10/2004 | ......... H01L 21/2885 |
| JP | 2011210803 | A * | 10/2011 | |

OTHER PUBLICATIONS

First Chinese Office Action and Search Report dated May 7, 2019.

* cited by examiner

PHOTOSENSITIVE ELEMENT AND MANUFACTURING METHOD THEREOF, DISPLAY PANEL AND MANUFACTURING METHOD THEREOF

CROSS REFERENCE TO RELATED APPLICATION

The application claims priority to the Chinese patent application No. 201810266890.9, filed on Mar. 28, 2018, the entire disclosure of which is incorporated herein by reference as part of the present application.

TECHNICAL FIELD

Embodiments of the present disclosure relate to a photosensitive element and a manufacturing method thereof, and a display panel and a manufacturing method thereof.

BACKGROUND

Copper indium gallium selenide (CIGS) materials have an extensive application in photosensitive elements such as thin-film solar cells due to a high absorptivity and a high conversion rate. How to further improve light absorptivity and light sensibility is an issue in the related field.

SUMMARY

At least an embodiment of the present disclosure provides a photosensitive element, comprising a first film layer, a second film layer and a third film layer. The first film layer, the second film layer and the third film layer are in a sequentially stacked structure, the first film layer is a p-type copper indium gallium selenide (CIGS) layer, the second film layer is an i-type CIGS layer, and the third film layer is an n-type film layer, and the first film layer, the second film layer and the third film layer form a PIN junction structure.

For example, the photosensitive element further comprises a first electrode layer at a side of the first film layer, which side is opposite to the second film layer, and the first film layer covers the first electrode layer and a material of the first electrode layer is copper or copper alloy.

For example, the first film layer and the first electrode layer are in a same pattern.

For example, a copper content of the first film layer is higher than a copper content of the second film layer.

For example, the third film layer is an n-type CIGS layer.

For example, the second film layer and the first film layer are in an integral structure.

For example, the photosensitive element further comprises a first electrode layer at a side of the first film layer, which side is opposite to the second film layer, and the first film layer covers the first electrode layer and a material of the first electrode layer is copper or copper alloy.

For example, the first film layer and the first electrode layer are in a same pattern.

For example, the third film layer is an n-type ZnO layer.

For example, the photosensitive element further comprises a CdS buffer layer between the second film layer and the third film layer.

At least an embodiment of the present disclosure further provides a display panel, comprising the above mentioned photosensitive elements.

For example, the display panel further comprises a switch transistor which is connected with the photosensitive element and comprises a source/drain electrode layer, and the source/drain electrode layer is at a side of the first film layer, which side is opposite to the second film layer and functions an electrode of the photosensitive element.

For example, a material of the source/drain electrode layer is copper or copper alloy.

For example, the source/drain electrode layer and the first film layer are in a same pattern.

At least an embodiment of the present disclosure further provides a method for manufacturing a photosensitive element, comprising: forming a first film layer, a second film layer and a third film layer in a stack. The first film layer is a p-type copper indium gallium selenide (CIGS) layer, the second film layer is an i-type CIGS layer, the third film layer is an n-type film layer, and the first film layer, the second film layer and the third film layer form a PIN junction structure.

For example, the method further comprises forming a first electrode at a side of the first film layer, which side is opposite to the second film layer, a material of the first electrode layer is copper or copper alloy, and forming the first film layer comprises: annealing the first film layer to allow a copper element in the first electrode to diffuse into the first film layer so to render the first film layer p-type.

For example, the first electrode layer and the first film layer are continuously formed and are in a same pattern.

For example, the third film layer is an n-type CIGS layer or an n-type ZnO layer.

At least an embodiment of the present disclosure further provides a method for manufacturing a display panel, comprising: forming a source/drain electrode layer, and forming a first film layer, a second film layer and a third film layer in a stack on the source/drain electrode layer. The first film layer is a p-type CIGS layer, the second film layer is an i-type CIGS layer, the third film layer is an n-type film layer, and the first film layer, the second film layer and the third film layer form a PIN junction structure.

For example, the source/drain electrode layer and the first film layer are continuously formed and are in a same pattern.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Researches show that when element composition in a copper indium gallium selenide (CIGS) film approaches the stoichiometric ratio of $Cu(In_xGa_{1-x})Se2$, the match between an absorption spectrum of the CIGS film and a solar spectrum reaches the optimum state. For example, the number range of x is about 0.6 to 0.8. On this basis, CIGS films can have different semiconductor performances by adjusting contents of the elements in the films. For example, in a Cu-rich condition, a copper atom occupies an indium vacancy to form an acceptor impurity $Cu_{In}$, rendering the CIGS film to be of p-type. For example, an indium atom occupies a copper vacancy to form a donor impurity $In_{Cu}$, rendering the CIGS film to be of n-type. For example, in a Se-poor condition, a donor-type selenium vacancy $V_{Se}$ is formed and the CIGS film is n-type.

Figure 1:
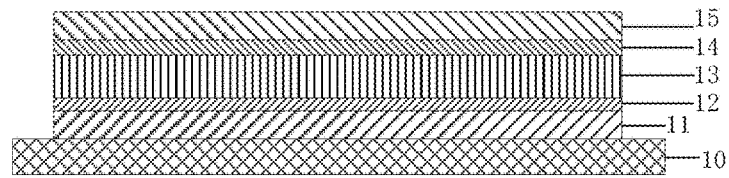
FIG. 1 is a sectional schematic view of a photosensitive element provided by an embodiment of the present disclosure.

FIG. 1 is a sectional schematic view of a photosensitive element 100 provided by an embodiment of the present disclosure. The photosensitive element 100 comprises a first electrode layer 11, a first film layer 12, a second film layer 13, a third film layer 14 and a second electrode layer 15, and these layers 11-15 are sequentially stacked on a substrate 10, i.e., in a sequentially stacked structure. Thus the first electrode 11 and the second film layer 13 are respectively formed at different sides of the first film layer 12. The first film layer 12 is a p-type CIGS layer, the second film layer 13 is an i-type CIGS layer, and the third film layer 14 is an n-type film layer, and thus the first film layer 12, the second film layer 13 and the third film layer 14 form a PIN junction structure. The first electrode layer 11 and the second electrode layer 15 are respectively the anode and the cathode of the photosensitive element 100.

In the PIN junction structure, an in-built electric field is formed pointing from the third film layer 14 (the n-type region) to the first film layer 12 (the p-type region). When the photosensitive element 100 receives light irradiation, the PIN junction structure absorbs light energy and generates photo-electron-hole pair, and the electron and the hole of the pair move towards the first film layer 12 and the third film layer 14 respectively so that the photo-current is generated. Because of the second film layer 13 (the intrinsic region, i.e. the i-type region), the in-built electric field is broad enough so that the photosensitive element can fully absorb the received light and convert the received light into an electrical signal.

In the PIN junction structure, it is the second film layer 13 (as the intrinsic region) that mainly functions as a light absorber, so the thickness of the second film layer 13 can be selected to be much greater than the thickness of the first film layer 12 and the thickness of the third film layer 14. For example, the thickness of the second film layer 13 is more than ten times as much as the thickness of the first film layer 12 or the thickness of the third film layer 14. For example, the thickness of the first film layer 12 and the third film layer 14 is about from 50 nm to 300 nm, and the thickness of the second film layer is about from 300 nm to 3000 nm.

For example, the first film layer 12 covers the first electrode layer 11, and the first film layer 12 and the first electrode layer 11 are in a same pattern, and for example, the projections of the first film layer 12 and the first electrode layer 11 on the substrate 10 coincide with each other.

For example, the material of the first electrode layer 11 can be a metal material, such as molybdenum (Mo), copper (Cu), Nickel (Ni), aluminum (Al) or an alloy of the above.

For example, the second film layer 13 and the second film layer 14 have an integrated structure and therefore have a same plan shape (or pattern), and for example, the projections of the second film layer 13 and the second film layer 14 on the substrate 10 coincide with each other.

For example, the first film layer 12, the second film layer 13 and the third film layer 14 have an integrated structure and therefore have a same plan shape (or pattern), and for example, the projections of the first film layer 12, the second film layer 13 and the third film layer 14 on the substrate 10 coincide with one another.

It should be noted that "having an integrated structure" in the present disclosure means structures formed as an integral structure though a same deposition process.

For example, the copper content of the first film layer 12 is higher than the copper content of the second film layer 13.

In the embodiment, the second electrode layer 15 is a block electrode (i.e., an electrode in a block shape), and the material of the second electrode layer 15 has a high light transmissivity and a low resistivity, and can be a transparent metal oxide material such as indium tin oxide (ITO), aluminum zinc oxide (AZO). In other embodiments, the second electrode layer 15 can be a metal grid electrode.

In the embodiment, the n-type third film layer 14 can be a light-entering layer (window layer). In a modified embodiment, the stacking order of the first film layer 12, the second film layer 13 and the third film layer 14 on the substrate 10 can be reversed, that is, the p-type first film layer 12 functions as the light-entering layer (window layer).

In the embodiment, the third film layer 14 is an n-type CIGS layer and has the same base material CIGS as the second film layer 13, almost no difference exists in the lattice sizes of the base materials of the third film layer 14 and the second film layer 13, so no lattice buffer layer needs to be provided additionally between the third film layer 14 and the second film layer 13.

Figure 2:
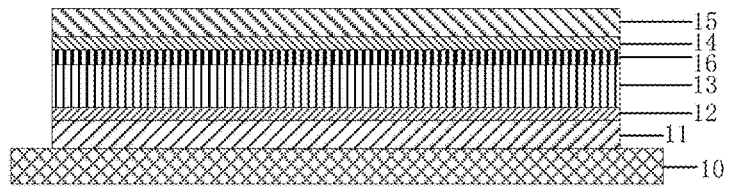
FIG. 2 is a sectional schematic view of a photosensitive element provided by another embodiment of the present disclosure.

In another embodiment, for example, referring to FIG. 2, compared to the embodiment as illustrated in FIG. 1, the material of the third film layer 14 can be zinc oxide, such as n-type zinc oxide. In this condition, because the lattice size difference between the second film layer 13 and the third film layer 14 is great, the photosensitive element further comprises a buffer layer 16 between the second film layer 13 and the third film layer 14, so as to alleviate the lattice mismatch between the second film layer 13 and the third film layer 14. For example, the buffer layer 16 can be a cadmium sulfide (CdS) layer.

In the photosensitive element provided by the embodiments and the modified embodiments of the present disclosure, a p-type CIGS film layer and an intrinsic CIGS film layer are adopted to form a PIN junction structure with an n-type material, so that no lattice mismatch exists between the p-type CIGS film material and the intrinsic CIGS film material, the interface defects of the absorption layer are reduced and light absorption and conversion rate of the photosensitive element are improved.

The photosensitive element 100 based on thin-film materials can have a variety of applications, such as forming an imaging element, or realizing a touch sensing function or a fingerprint recognition based on the photosensitive principle and the like. Further, the photosensitive element 100 can be integrated in a display panel through micro-nano electronic technologies to realize the above mentioned functions, so as to obtain a display panel with a touch sensing function, a display panel with a fingerprint recognition function or the like.

An embodiment of the present disclosure provides a display panel 200 comprising the photosensitive element 100. The display panel can be for example a liquid crystal display panel, an organic light-emitting diode (OLED) display panel or the like. Detailed descriptions are given below taking an OLED display panel using the photosensitive element 100 to realize fingerprint recognition functions as an example, which is not limited to the present disclosure.

Figure 3:
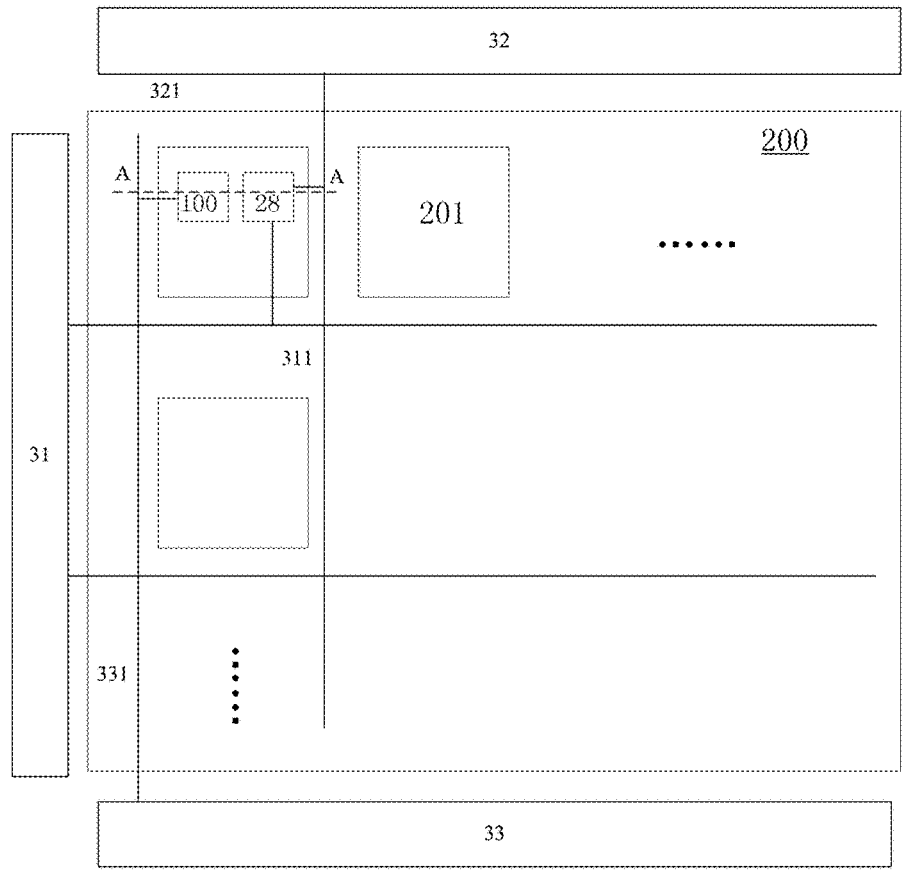
FIG. 3 is a plan schematic view of a display panel provided by an embodiment of the present disclosure.

FIG. 3 is a plan schematic view of a display panel 200 provided by an embodiment of the present disclosure. The display panel 200 comprises a plurality of pixel units 201 disposed in an array. Each pixel unit comprises at least one light-emitting element 20 and a photosensitive element 100. The display panel 200 further comprises a gate driving circuit 31, a data driving circuit 32 and a photosensitive detection circuit 33. The light-emitting element is an organic light-emitting diode (OLED) for example.

The light-emitting element 28 is connected to the gate driving circuit 31 through a gate line 311 and is connected to the data driving circuit 32 through a data line 321, and therefore can be driven by gate signals and data signals provided by the gate driving circuit 31 and the data driving circuit 32. The photosensitive element 100 is connected to the photosensitive detection circuit 33 through a detection line 331 so as to transport the detected photoelectric signal to the photosensitive detection circuit 33.

Figure 4A:
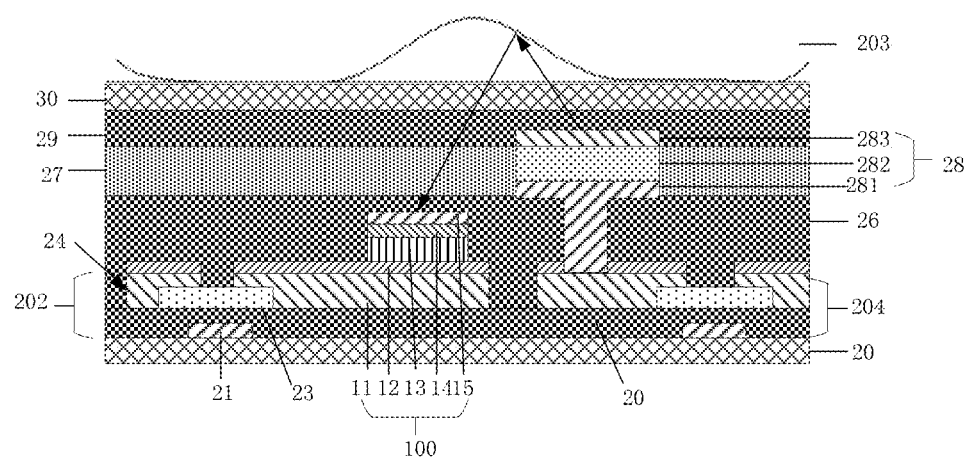
FIG. 4A is a sectional view along line A-A of FIG. 3.

FIG. 4A is a sectional schematic view along a sectional line A-A of FIG. 3. Referring to FIG. 4A together, as illustrated in the figure, the display panel 200 comprises a pixel array structure, the photosensitive element 100 and the light-emitting element 28, which are provided on a first substrate 20. The pixel array structure comprises a pixel circuit, the gate line, the data line, a power source line (not shown) and the like, which are configured to drive the light-emitting element 28. The pixel circuit comprises a conventional OLED pixel drive circuit, for example, a 2T1C pixel circuit, that is, each pixel unit comprises two thin-film transistors (TFT) and one storage capacitor Cs. One of the two TFTs is a switch transistor and the other is a drive transistor, and a source electrode or a drain electrode of the drive transistor is electrically connected with the light-emitting element 28. Other than the conventional 2T1C pixel circuit, the pixel circuit can comprise a 3T1C OLED pixel circuit, or further comprise an OLED pixel circuit having a compensation function, a reset function or the like, which is not limited in embodiments of the present disclosure. For clarity, FIG. 4A only illustrates the light-emitting element 28 and a thin film transistor directly connected with the light-emitting element 28 of the pixel circuit, and the thin film transistor is a drive transistor 204 which drives the light-emitting element 28 to emit light for example, but this is not limited in embodiments of the present disclosure. In other embodiments, the thin film transistor can be a light-emitting control transistor controlling whether a current driving the light-emitting element 28 to emit light runs through or not.

As shown in the figure, the display panel 200 comprises a switch transistor 202 connected with the photosensitive element 100, and the switch transistor 202 can be a thin-film transistor for example. One electrode of the photosensitive element 100 is connected with a source electrode or a drain electrode of the switch transistor 202 and is further connected to the photosensitive detection circuit 33 through the switch transistor 202. As illustrated in FIG. 4A, the first electrode layer (i.e., the anode) 11 of the photosensitive element 100 is electrically connected with the switch transistor 202. In another embodiment, it can be the second electrode layer (i.e., the cathode) 15 that is electrically connected with the switch transistor 202; that is, the stacking order of the first film layer 12, the second film layer 13 and the third film layer 14 on the substrate 10 can be reversed, which is not limited in the embodiments of the present disclosure.

Figure 4B:
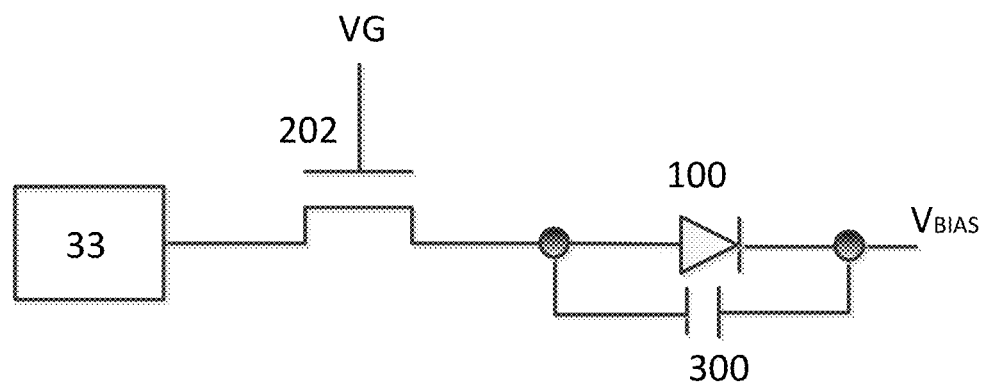
FIG. 4B illustrates a diagram of a photosensitive circuit applying a photosensitive element provided by an embodiment of the present disclosure.

FIG. 4B illustrates a diagram of a photosensitive circuit applying a photosensitive element provided by an embodiment of the present disclosure. As illustrated in the figure, the photosensitive circuit comprises the switch transistor 202, the photosensitive element 100 and a capacitor 300. The anode of the photosensitive element 100 is connected with the source electrode or the drain electrode of the switch transistor 202, and is connected to the photosensitive detection circuit 33 through the switch transistor 202. The cathode of the photosensitive element 100 is connected to a biased voltage $V_{BIAS}$. In this embodiment, the biased voltage $V_{BIAS}$ is a high level to bias the photosensitive element reversely. The gate electrode of the switch transistor 202 is configured to receive a control signal $V_G$. The capacitor 300 is connected between the anode and the cathode of the photosensitive element 100.

A working process of the photosensitive circuit comprises: during a reset period, the control signal $V_G$ is an ON (turn-on) signal, the switch transistor 202 is switched on, and the photosensitive detection circuit 33 writes a reset signal into the capacitor 300 to reset the capacitor 300; during a photosensitive period, the control signal $V_G$ is an OFF (turn-off) signal, the switch transistor 202 is switched off, and the photosensitive element 100 generates photocarriers under the reflected light and charges the capacitor 300, so as to allow the capacitor 300 generate and store a data voltage; during a detection period, the control signal $V_G$ is an ON signal, the switch transistor 202 is switched on, and the photosensitive detection circuit 33 reads the data voltage that is stored in the capacitor 300 through the switch transistor 202 and then analyzes the data voltage for forming a fingerprint image.

In another example, the cathode of the photosensitive element 100 is connected with the source electrode or the drain electrode of the switch transistor 202. In this condition, the biased voltage $V_{BIAS}$ is a low level (e.g., to be grounded) so as to render the photosensitive element 100 reversely biased. The working process of the photosensitive element 100 is similar to the above and is not repeated here accordingly.

In this embodiment, the switch transistor 202 is of a bottom-gate type, and comprises a gate electrode layer 21, a gate insulation layer 22, an active layer 23 and a source-drain electrode layer 24 which are stacked in that order. The source-drain electrode layer 24 comprises a source electrode and a drain electrode. In other embodiments, the switch transistor 202 can also be of a bottom-gate type.

For example, the light-emitting element 28 can be an organic light-emitting diode and comprises a first electrode 281, a second electrode 283 and an organic light-emitting layer 282 and the like. The first electrode 281 is electrically connected with the source electrode or the drain electrode of the drive transistor 204.

For example, the switch transistor 202 and the driving transistor 204 both have a top-gate structure or a bottom-gate structure, and are insulated from each other. Corresponding layers of the switch transistor 203 and the driving transistor 204 can be formed in a same process.

For example, the source-drain electrode layer 24 is at a side of the first film layer 12, which side is away from the second film layer 13 and directly functions as the first electrode layer 11 of the photosensitive element 100, or is electrically connected with the first electrode layer 11 of the photosensitive element 100. That is, the source electrode or the drain electrode of the source-drain electrode layer 24 directly functions as the first electrode layer 11 of the photosensitive element 100, or is electrically connected with the first electrode layer 11 of the photosensitive element 100.

For example, the pattern of the source-drain electrode layer 24 is same or approximately same as the pattern of the first film layer 12, so that the first film layer 12 can function as a protection layer of the source-drain electrode layer 24 to prevent the source-drain electrode layer 24 from being oxidized in subsequent processes.

For example, the material of the source-drain electrode layer 24 is copper or copper alloy, which allows the copper element of the source-drain electrode layer to diffuse into the first film layer during an annealing process so as to render the first film layer a Cu-rich p-type layer, so that the p-type treatment to the first film layer can be saved.

For example, the display panel 200 can further comprise a planarization layer 26 on the photosensitive element 100, and the light-emitting element 28 is connected with the source electrode or the drain electrode of the drive transistor 204 through a hole running through the planarization layer 26 and the first film layer 12.

For example, the display panel 200 can further comprise a passivation layer (not shown) enclosing a side wall of the photosensitive element 100 to prevent an electric leakage. The passivation layer can be silicon oxides or nitrides.

For example, the display panel 200 can further comprise a pixel defining layer (PDL) 27 on the planarization layer 26, which is configured to separate adjacent organic light-emitting layers from each other so as to prevent cross talk of color. Openings are formed in the pixel defining layer 27 so as to define a pixel region (an opening region) and a pixel gap region in the pixel defining layer 27. The pixel region exposes the first electrode 281 of the light-emitting element 28, and the organic light-emitting layer 292 and the second electrode 283 of the light-emitting element 28 are sequentially formed on the first electrode 281.

For example, the display panel 200 can further comprise an encapsulation layer 29 on the light-emitting element 28 and a second substrate 30 for encapsulation.

During the fingerprint recognition of the display panel 200, the touch subject (i.e., a finger of the user) approaches or touch the second substrate 30, and the light-emitting element 28 emits light which is irradiated on the touch object 203, for example, a finger, and reflected to the photosensitive element 100. Because a finger valley (the concave surface) and a finger ridge (the convex surface) of the finger have different light reflectivity, the photosensitive elements 100 at different positions receive light of different intensity and generates different electric signals, which are transported to the photosensitive detection circuit 33 to be amplified and analyzed so as to obtain an image of the finger surface of the finger, and the image is further used for fingerprint recognition. The recognition result can be used for functions such as unlocking system, payment and so on.

For example, the photosensitive detection circuit 33 can integrate a driving circuit, a detection circuit, a processor and the like. For example, the photosensitive detection circuit 33 can be coupled to the pixel array structure through a flexible printed circuit (FPC). The type of the photosensitive detection circuit 33 is not limited in the embodiments of the present disclosure.

For example, to improve a detection precision, the display panel 200 can comprise a plurality of photosensitive elements 100, that is, plural pixel units 201 comprise a photosensitive element 100. Each photosensitive element 100 detects a fingerprint image of a corresponding region of the touch object 203, and the obtained fingerprint images are combined together to generate a complete fingerprint image.

In an example of the embodiment, the light-emitting element 28 is of top-emission type. In this condition, the first electrode 281 is a reflective electrode, so that light emitted from the organic light-emitting layer 282 can be reflected to the second substrate 30 at the display side and the emission efficiency of the light-emitting element 28 can be improved. For example, the first electrode 281 is an anode of the light-emitting element 28 and can be made from a stack structure of indium tin oxide (ITO) and a metal layer for example. The second electrode 282 is a cathode of light-emitting element 28 has a high light transmissivity. For example, the second electrode 282 is a cathode of the light-emitting element 28 and can be made from a metal with a low work function such as Ag, Al, Ca, In, Li and Mg or a metal alloy with a low work function such as Mg/Ag alloy.

At least an embodiment of the present disclosure further provides a manufacturing method of the photosensitive element according to embodiments of the present disclosure. The manufacturing method comprises forming a first film layer, a second film layer and a third film layer in a stack. The first film layer is a p-type copper indium gallium selenide (CIGS) layer, the second film layer is an i-type CIGS layer, the third film layer is an n-type film layer, and the first film layer, the second film layer and the third film layer form a PIN junction structure.

In an embodiment, the manufacturing method comprises directly sequentially forming the first electrode layer, the p-type copper indium gallium selenide (CIGS) layer, the i-type CIGS layer, the n-type film layer and the second electrode layer, so as to form the photosensitive element 100 as illustrated in FIG. 1.

For example, the first electrode layer is formed through sputtering. For example, the material of the first electrode layer is a metal material, such as molybdenum (Mo), copper (Cu), Nickel (Ni), aluminum (Al) or an alloy of the above.

The p-type copper indium gallium selenide (CIGS) layer and the i-type CIGS layer can be formed through the processes such as deposition or sputtering and during the forming process, the stoichiometric ratio is adjusted to obtain the p-type copper indium gallium selenide (CIGS) layer and the i-type CIGS layer respectively. For example, the p-type copper indium gallium selenide (CIGS) layer and the i-type CIGS layer are formed through sputtering in combination with a selenization method. One example of the selenization method comprises forming a copper indium gallium (CuInGa) alloy prefabricated layer first and then forming a p-type CIGS film or an i-type CIGS layer through a selenization method. For example, the p-type CIGS layer and the i-type CIGS layer can be further formed through a co-evaporation method, such as a one-step, two-step or three-step co-evaporation method. The method comprises adopting four types of evaporation sources, i.e., copper, indium, gallium and selenium, to form the p-type CIGS film layer or the i-type CIGS film layer through thermal evaporation. For example, during the formation of the p-type CIGS layer, a sputtering power and/or a evaporation speed of the evaporation source is adjusted to allow the stoichiometric ratio of copper in the generated CIGS film layer is higher than the stoichiometric ratio of copper in the intrinsic CIGS film layer, so as to obtain a p-type CIGS film layer, because a Cu-rich CIGS film is p-type. These are the processes for forming a film, and other proper processes can be employed to form the film.

For example, the n-type film layer is an n-type CIGS film layer, which can also be obtained through adjusting the stoichiometric ratios of the element according to the above mentioned conventional processes. For example, a evaporation speed of the evaporation source can be adjusted to allow the stoichiometric ratio of selenium in the generated CIGS film layer is lower than the stoichiometric ratio of selenium in the intrinsic CIGS film layer, so as to obtain an n-type CIGS film layer, because a Se-poor CIGS film is n-type. In this condition, because the first film layer, the second film layer and the third film layer all adopts a CIGS film, and almost no lattice size difference exists therebetween, no lattice buffer layer needs to be provided additionally.

For example, the n-type layer is an n-type zinc oxide layer, which can be formed through sputtering processes. In this condition, a buffer layer needs to be provided between the second film layer and the n-type to alleviate the lattice mismatch between the CIGS film and the ZnO film. For example, the buffer layer is a cadmium sulfide (CdS) layer.

Figure 5A:
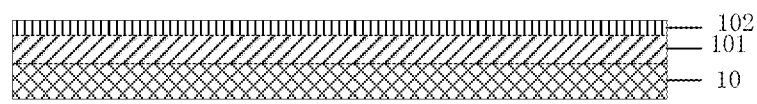
FIG. 5A-5C are schematic sectional views of steps of an exemplary manufacturing method of a photosensitive element provided by an embodiment of the present disclosure.
Figure 5B:
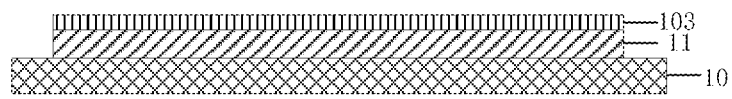
Figure 5C:

Referring to FIG. 5A-5C, in another embodiment, the manufacturing method of the photosensitive element comprises the following steps.

Step 51: as illustrated in FIG. 5A, a first electrode material layer 101 and an intrinsic CIGS material layer 102 are continuously formed in one process on a substrate 10, and the material of the first electrode material layer 101 is copper or copper alloy. For example, a sputtering process is used to form the first electrode material layer 101 and the intrinsic CIGS material layer 102 thereon. For example, the first electrode material layer 101 and the intrinsic CIGS material layer 102 can be continuously formed in a same sputtering chamber by altering the target materials, without opening the chamber during the operation.

Step 52: as illustrated in FIG. 5B, a patterning process is performed to the first electrode material layer 101 and the intrinsic CIGS material layer 102 to form a first electrode layer 11 and an intrinsic CIGS layer 103 together and in this situation, the first electrode layer 11 and the intrinsic CIGS layer 103 are in a same pattern.

Step 53: as illustrated in FIG. 5C, an annealing treatment is performed to allow copper element of the first electrode material layer 101 to diffuse into the intrinsic CIGS layer 103 so as to render the intrinsic CIGS layer 103 a p-type CIGS layer, that is, to form the first film layer 12. The annealing treatment can be performed through a variety of suitable manners, such as a rapid thermal annealing.

Subsequently an intrinsic CIGS layer, an n-type layer and a second electrode layer 15 are formed, so as to form the photosensitive element as illustrated in FIG. 1.

During the above processes, the first electrode material layer 101 is always in a vacuum environment for the sputtering process from the state of being formed to the state of being covered by the intrinsic material layer, and is protected by the CIGS material layer during the subsequent patterning process, so the first electrode material layer 101 is prevented from being oxidized during the manufacturing process (e.g., a deposition of a dielectric layer) and further a manufacturing process for forming a protection layer for the source-drain electrode layer is saved. Meanwhile, because copper or copper alloy is adopted as the material for the first electrode layer, the subsequent annealing process can be utilized to allow copper element to diffuse to form a Cu-rich CIGS film, so that the p-type treatment to the CIGS film is realized and the process is simplified.

For example, after forming the first film layer 12, processes are conducted to form a relatively thick intrinsic CIGS layer, and perform an n-type treatment on the surface of the CIGS layer to render the portion closer to the surface of the CIGS layer to become n-type and to allow the other portion of the CIGS layer to remain the intrinsic state, so as to form the intrinsic second film layer 13 and the n-type third film layer 14 respectively. In this example, the second film layer 13 and the third film layer 14 are formed by a same deposition process so as to have an integrated structure.

Figure 6A:
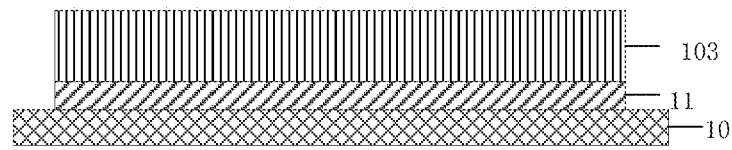
FIG. 6A-6B are schematic sectional views of steps of an exemplary manufacturing method of a photosensitive element provided by another embodiment of the present disclosure.
Figure 6B:
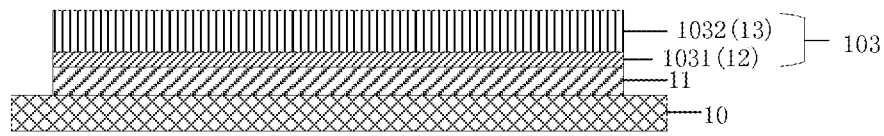

In another embodiment, referring to FIG. 6A-6B, the thickness and the annealing time of the intrinsic CIGS material layer 102 are controlled so as to allow the intrinsic CIGS layer 103 to comprise a first sub-layer 1031 and a second sub-layer 1032, and the first sub-layer 1031 is closer to the first electrode layer 11. During the annealing process, the copper elements (atoms) of the first electrode layer 11 diffuse into the first sub-layer 1031 to render the first sub-layer 1031 to be Cu-rich and therefore a p-type CIGS layer, that is, the first film layer 121, while the second sub-layer 1032 remains intrinsic to become the second film layer 13, that is, the first film layer 12 and the second film layer 13 are formed in an integrated structure or in a single body, and the copper content of the first film layer 12 is higher than the copper content of the second film layer 13.

Figure 7A:
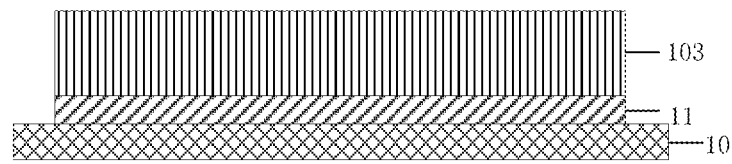
FIG. 7A-7B are schematic sectional views of steps of an exemplary manufacturing method of a photosensitive element provided by still another embodiment of the present disclosure.
Figure 7B:
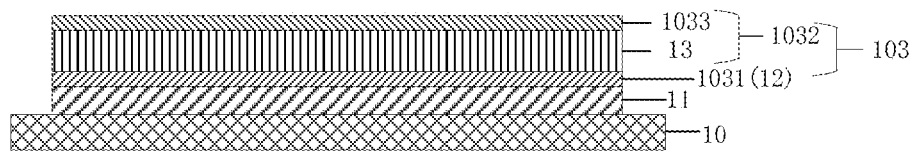

In still another embodiment, referring to FIG. 7A-7B, the thickness and the annealing time of the intrinsic CIGS material layer 102 are controlled so as to allow the intrinsic CIGS layer 103 to comprise a first sub-layer 1031 and a second sub-layer 1032, and the first sub-layer 1031 is closer to the first electrode layer 11. During the annealing process, copper elements (atoms) of the first electrode layer 11 diffuse into the first sub-layer 1031 to render the first sub-layer 1031 to be Cu-rich and therefore a p-type CIGS layer, that is, the first film layer 12, while the second sub-layer 1032 remains intrinsic. Subsequently, an n-type treatment is performed to the second sub-layer 1031 to allow a film layer 1033 closer to a surface of the second sub-layer to become n-type, that is, the third film layer 14 and the other portion of the second sub-layer remains intrinsic to form the second film layer 13; that is, the first film layer 12, the second film layer 13 and the third film layer 14 are formed by a same deposition process so as to have an integrated structure.

Embodiments of the present disclosure further provide a manufacturing method of the display panel, and exemplary descriptions are given below about the manufacturing method of the display panel provided by the embodiments of the present disclosure in combination with FIG. 8A-8C.

Step 81: a first substrate 20 is provided, cleaned and dried. The first substrate 20 can be a bendable and flexible substrate, such as substrates made of all kinds plastic films like polyethylene glycol terephthalate (PET), polyether sulfone (PES), polycarbonate, polyimide and ramifications of the above. Or, the first substrate 20 can be a rigid substrate, such as a glass substrate, a stainless steel substrate and the like.

Figure 8A:
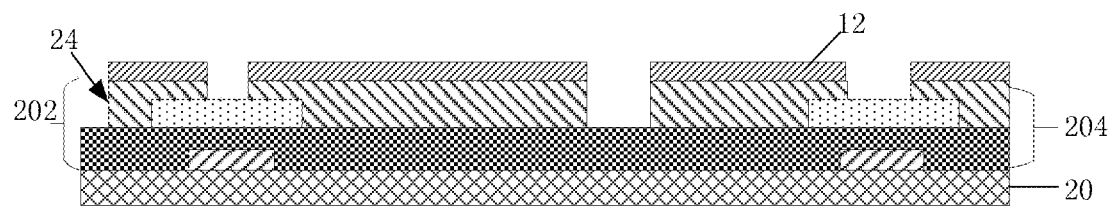
FIG. 8A-8C are schematic sectional views of steps of an exemplary manufacturing method of a display panel provided by an embodiment of the present disclosure.

Step 82: referring to FIG. 8A, a switch transistor 203 and a driving transistor 204 are formed on the first substrate 20 and insulated from each other.

For example, the switch transistor 202 and the driving transistor 204 both have a top-gate structure or a bottom-gate structure, and corresponding layers of the switch transistor 203 and the driving transistor 204 can be formed in a same process.

For example, a gate layer, a gate insulation layer, an active layer and a source-drain electrode layer 24 of the switch transistor 202 and the driving transistor 204 are sequentially formed.

For example, the active layer can be of a variety of types, such as amorphous silicon, poly-silicon (low-temperature poly-silicon, high-temperature poly-silicon), metal oxide semiconductor or the like.

Figure 8B:
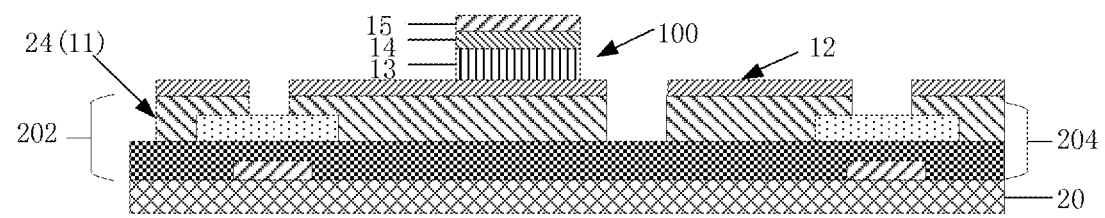

Step S83: referring to FIG. 8B, a photosensitive element 100 is formed on the source-drain electrode layer 24. Here the source-drain electrode layer 24 directly functions as a first electrode layer of the photosensitive element 100, and a second film layer 13, a third film layer 14 and a second electrode layer 15 are formed on the source-drain electrode layer 24. The first film layer 12 is a p-type CIGS layer, the second film layer is an i-type CIGS layer, and the third film layer 14 is an n-type layer, so that the first film layer 12, the second film layer 13 and the third film layer 14 together form a PIN junction structure.

For example, the first film layer 12, the second film layer 13 and the third film layer 14 can be sequentially formed. For example, the above conventional processes for forming a CIGS film can be used to form a p-type CIGS film, an i-type CIGS film and an n-type CIGS film sequentially through adjusting the stoichiometric ratio of elements.

For example, the source-drain electrode layer 24 and the first film layer 12 can be continuously formed in a process and are in a same pattern. For example, the source-drain electrode layer 24 and the first film layer 12 are continuously formed in a same sputtering chamber by altering the target materials, without opening the chamber during the operation. For example, a source-drain electrode film layer and a first film material layer thereon are continuously formed through a sputtering process, and then the source-drain electrode layer 24 and the first film layer 12 are obtained by patterning the source-drain electrode film layer and the first film material layer in a same patterning process. During the process, the first electrode material layer is always in a vacuum environment of the sputtering process from the state of being formed to the state of being covered by the first film material layer, and is protected by the first film material layer during the subsequent patterning process, so the first electrode material layer 101 is prevented from being oxidized during the manufacturing process (e.g., the deposition process of a dielectric layer) and further a manufacturing process for forming a protection layer for the source-drain electrode layer is saved. Then, for example, the integrated second film layer 13 and third film layer 14 can be formed through a same deposition process.

For example, the material of the source-drain electrode layer 24 is copper or copper alloy.

In another example, a relatively thicker intrinsic CIGS layer can be formed on the source-drain electrode layer 24; during a subsequent annealing process, copper elements of the first electrode layer diffuse into the intrinsic CIGS layer to allow the intrinsic CIGS layer to comprise a first sub-layer and a second sub-layer, and the first sub-layer is closer to the source-drain electrode layer 24 and is rendered to be Cu-rich through the annealing so as to become a p-type CIGS layer, that is, the first film layer 12. The second sub-layer remains intrinsic and become the second film layer 13. For example, the annealing process can be performed together with an annealing process to the active layer of the driving transistor.

In another example, a relatively thicker intrinsic CIGS layer can be formed on the source-drain electrode layer 24; during a subsequent annealing process, copper elements of the first electrode layer diffuse into the intrinsic CIGS layer to allow the intrinsic CIGS layer to comprise a p-type first sub-layer and an i-type second sub-layer and the first sub-layer is closer to the first electrode layer. During the annealing process, copper elements of the source-drain electrode layer 24 diffuse into the first sub-layer to render the first sub-layer to be Cu-rich and therefore become a p-type CIGS layer, that is, the first film layer 12, while the second sub-layer remains intrinsic. Subsequently, an n-type treatment is performed to the second sub-layer to allow the film layer closer to the surface of the second sub-layer to become n-type, that is, the third film layer 14, while the other portion of the second sub-layer remains intrinsic to form the second film layer 13. For example, the annealing process can be performed together with an annealing process to the active layer of the driving transistor.

Figure 8C:
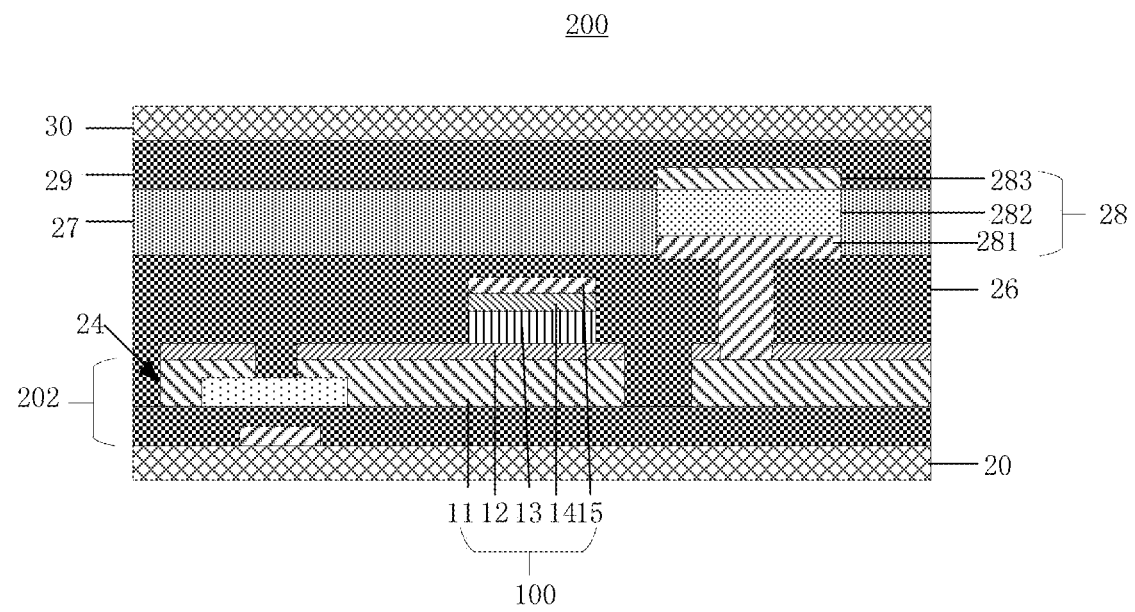

Step S84, referring to FIG. 8C, a planarization layer 26 is formed on the second electrode layer 15; a via hole is formed in the planarization layer 26 in a position corresponding to the source-drain electrode layer of the driving transistor 204 and the via hole further runs through the first film layer 12. Subsequently, a first electrode 281 is formed and is electrically connected with the source-drain electrode layer of the driving transistor 204 through the via hole running through the planarization layer 26 and the first film layer 12. Then a pixel defining layer 27 is formed and an opening is formed in the pixel defining layer 27 in a region corresponding to the first electrode 281. Then an organic light-emitting layer 282, a second electrode 283 are sequentially formed in the opening to form a light-emitting element, and an encapsulation layer 29 is formed and a second substrate 30 is attached, so that the display panel as illustrated in FIG. 4A is formed here.

In the photosensitive element and the manufacturing method thereof, the display panel and the manufacturing method thereof according to embodiments of the present disclosure, a p-type CIGS film layer and an intrinsic CIGS film layer are adopted to form a PIN junction structure with an n-type material, so no lattice mismatch exists between the p-type CIGS film material and the intrinsic CIGS film material, interface defects of the absorption layer are reduced and light absorption and conversion rate of the photosensitive element are improved.

What are described above is related to the illustrative embodiments of the disclosure only and not limitative to the scope of the disclosure; the scopes of the disclosure are defined by the accompanying claims.

What is claimed is:

1. A photosensitive element, comprising a first film layer, a second film layer and a third film layer,
   wherein the first film layer, the second film layer and the third film layer are in a sequentially stacked structure,
   the first film layer is a p-type copper indium gallium selenide (CIGS) layer, the second film layer is an i-type CIGS layer, and the third film layer is an n-type film layer, and
   the first film layer, the second film layer and the third film layer form a PIN junction structure;
   the photosensitive element further comprises a first electrode at a side, opposite to the second film layer, of the first film layer, the first film layer covers the first electrode and the first electrode is a single-layer copper electrode;
   the first film layer is formed by disposing an i-type CIGS material and is rendered p-type by diffusion of copper elements from the first electrode to the i-type CIGS material;
   a thickness of the second film layer is more than 10 times as much as a thickness of the first film layer.

2. The photosensitive element according to claim 1, wherein the first film layer and the first electrode are in a same pattern.

3. The photosensitive element according to claim 1, wherein a copper content of the first film layer is higher than a copper content of the second film layer.

4. The photosensitive element according to claim 1, wherein the third film layer is an n-type CIGS layer.

5. The photosensitive element according to claim 4, wherein the second film layer and the third film layer are in an integral structure.

6. The photosensitive element according to claim 1, wherein the third film layer is an n-type ZnO layer.

7. The photosensitive element according to claim 6, further comprising a CdS buffer layer between the second film layer and the third film layer.

8. A display panel, comprising the photosensitive element of claim 1.

9. The display panel according to claim 8, further comprising a switch transistor which is connected with the photosensitive element and comprises a source electrode and a drain electrode,
   wherein the source electrode, the drain electrode and the first electrode of the photosensitive element are all in a same layer and made of a same material;
   the first electrode of the photosensitive element and the source electrode are electrically connected in an integral structure.

10. The display panel according to claim 9, further comprising a light-emitting element and a drive transistor, wherein a first electrode of the light-emitting element is electrically connected with a source electrode of the drive transistor;
    the display panel further comprises a film layer portion on a side of the source electrode of the drive transistor close to the light-emitting element, the film layer portion is in a same layer and made of a same material as the first film layer, and the first electrode of the light-emitting element is electrically connected with a source electrode of the drive transistor through an opening in the film layer portion.

11. The display panel according to claim 9, wherein the source electrode of the switch transistor and the first film layer are in a same pattern.

12. The photosensitive element according to claim 1, further comprising a second electrode on a side of the third film layer away from the first electrode and is in direct contact of the third film layer.

13. The photosensitive element according to claim 12, wherein the first film layer, the second film layer and the third film layer are in an integral structure.

14. A method for manufacturing a photosensitive element, comprising:
    forming a first electrode, a first film layer, a second film layer and a third film layer in a stack,
    wherein the first film layer is a p-type copper indium gallium selenide (CIGS) layer, the second film layer is an i-type CIGS layer, the third film layer is an n-type film layer, and the first film layer, the second film layer and the third film layer form a PIN junction structure;
    a thickness of the second film layer is more than 10 times as much as a thickness of the first film layer;
    the first electrode is a single-layer copper electrode and forming the first film layer comprises: disposing an i-type CIGS material and causing copper elements to diffuse from the first electrode to the i-type CIGS material to form the p-type first film layer.

15. The method according to claim 14, wherein causing copper elements to diffuse from the first electrode to the first film layer to render the first film layer p-type comprises:
    annealing the first film layer to allow the copper elements in the first electrode to diffuse into the first film layer so to render the first film layer p-type.

16. The method according to claim 15, wherein the first electrode layer and the first film layer are continuously formed and are in a same pattern.

17. The method according to claim 14, wherein the third film layer is an n-type CIGS layer or an n-type ZnO layer.

18. A method for manufacturing a display panel, comprising:
    forming a source/drain electrode, and
    forming a first film layer, a second film layer and a third film layer in a stack on the source/drain electrode,
    wherein the first film layer is a p-type CIGS layer, the second film layer is an i-type CIGS layer, the third film layer is an n-type film layer, and the first film layer, the second film layer and the third film layer form a PIN junction structure;
    a thickness of the second film layer is more than 10 times as much as a thickness of the first film layer;
    the source/drain electrode is a single-layer copper electrode and forming the first film layer comprises: disposing an i-type CIGS material and causing copper elements to diffuse from the source/drain electrode to the i-type CIGS material to form the p-type first film layer.

19. The method according to claim 18, wherein the source/drain electrode and the first film layer are continuously formed and are in a same pattern.

\* \* \* \* \*